Sept. 4, 1962 W. J. SMITH 3,052,853
ATTENUATOR FOR STRONG SIGNALS IN A RADIO RECEIVER
Filed June 3, 1959
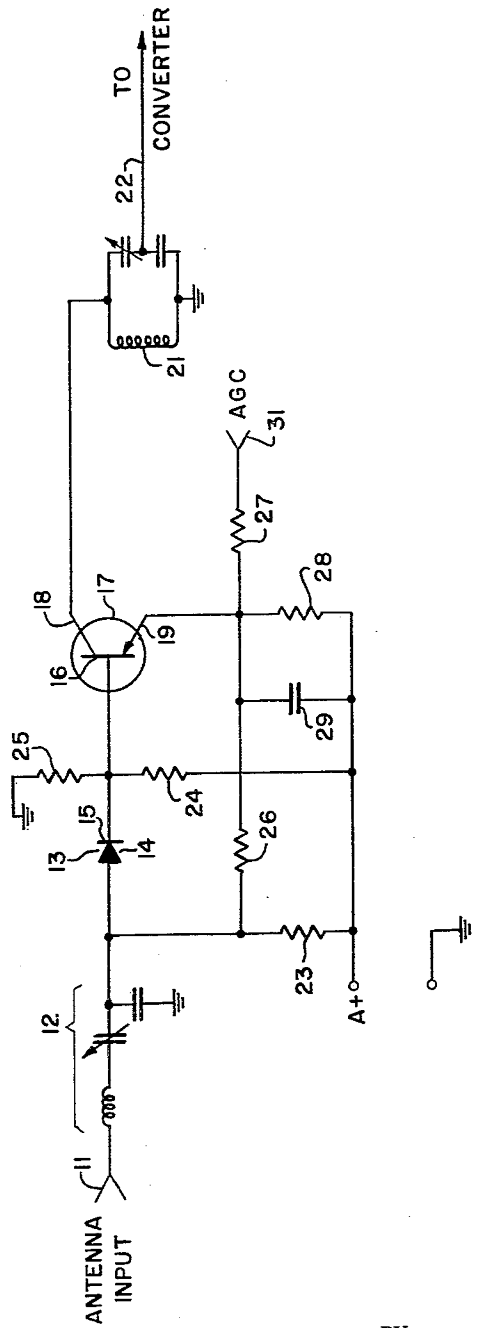
INVENTOR
WILLIAM J. SMITH
BY Robert T. Tillman
ATTORNEY

United States Patent Office 3,052,853
Patented Sept. 4, 1962

3,052,853

ATTENUATOR FOR STRONG SIGNALS IN A RADIO RECEIVER

William J. Smith, Silver Spring, Md., assignor to The Bendix Corporation, a corporation of Delaware
Filed June 3, 1959, Ser. No. 817,939
2 Claims. (Cl. 330—24)

This invention relates generally to transistor circuits and more particularly to such circuits in which the gain of signals translated by a transistor stage can be controlled over a wide range.

The use of transistor amplifiers to replace vacuum tube amplifiers has resulted in problems peculiar to the transistor in signal circuits where a wide dynamic range of signals must be translated. A particular application where a wide range of signals is encountered is in the input amplifier stage of a radio receiver for mobile equipment and particularly for broadcast receivers as used in passenger automobiles. In such circuits the transistor is subject to undesirable distortion at high signal input levels. Although conventional automatic gain control techniques have been employed it has been found that the transistor, even for a gain control potential of magnitude sufficient to cut off the transistor as a gain producing device, nevertheless couples sufficient energy to the output circuit to overload subsequent stages.

It is an object of the present invention to provide a composite automatic gain control and diode attenuator circuit which is able to translate signals over an extremely wide range.

Another object of the invention is to provide a transsistor gain control stage in combination with a diode attenuator in which the cut-off action of the two semiconductor devices is stagger controlled.

A further object of the invention is to provide an input stage for a radio receiver with sufficient controlled attenuation to avoid blocking the local oscillator of the receiver or overloading the output intermediate frequency stage on reception of strong signals.

A further object of the invention is to provide an input stage for a radio receiver which permits the radio receiver to be turned on in the presence of a strong signal and operate satisfactorily, without the initial blocking phenomenon.

These and other objects of the invention will be apparent from the following detailed description taken in conjunction with the accompanying drawing wherein the single FIGURE shows a schematic circuit diagram of an input stage for a radio receiver.

The present invention provides a wide dynamic range of gain and attenuation control by applying a successive control signal to control the gain of a transistor and the resistance of a diode semiconductor to provide a range of control including both variable gain and variable attenuation.

Referring now to the drawing, a preferred embodiment of the invention is shown as comprising an antenna input terminal 11 and a conventional coupling circuit 12 for applying antenna signals to the amplifying channel of a radio receiver. A control circuit comprises a semiconductor diode 13 having an anode 14 and cathode 15. The coupling circuit 12 from the antenna terminal 11 is connected directly to the anode 14 and the cathode 15 is directly connected to a base 16 of a transistor 17. The transistor 17 has a collector 18 connected to a tuned circuit 21 which supplies signals to a converter circuit, not shown, from an output lead 22.

The anode 14 of diode 13 is connected to the positive side of a supply battery through a resistor 23. The cathode 15 is connected to the positive supply through resistor 24 which cooperates with the resistor 25 to provide a voltage divider from the positive supply to ground for the purpose of maintaining the cathode 15 of diode 13 and the base 16 of transistor 17 at a substantially fixed potential. The anode 14 of diode 13 is supplied with automatic gain control potential through resistors 26 and 27. The emitter 19 of transistor 17 is supplied with self bias through a resistor 28, capacitor 29 and is supplied by automatic gain control potentials through resistor 27.

Resistors 24, 25 are proportioned to maintain the cathode 15 and base 16 at a substantially constant potential. For zero input signal the automatic gain control input to terminnal 31, derived in any conventional fashion, will be substantially zero volts so that resistors 23, 26 and 27 form a voltage divider from the positive supply to maintain a voltage on the anode 14, such that diode 13 is forward biased and presents a very low resistance to the signal coupled thereto from the antenna 11. For this same zero signal condition with the automatic gain control potential being substantially zero, the emitter base diode 16—19 is forward biased such that the transistor 17 provides normal high gain for signals applied to base 16. As the signal level increases, the automatic gain control potential applied to terminal 31 increases in conventional fashion, with the result that the junction of resistors 27 and 28 moves toward ground potential, thus reducing the gain of transistor 17 and eventually cutting off the transistor 17. A portion of the voltage at the junction of resistors 27, 28 is applied via the voltage division of resistors 26, 23 to the anode 14 of diode 13. Thus, the forward bias on the diode 13 for a zero signal condition is reduced and becomes a backward bias for high level signals, thereby introducing the backward resistance of the diode 13 into the circuit which resistance increases as the automatic gain control potential from terminal 31 further increases in magnitude. The backward resistance of diode 13 and the parallel combination of resistors 24 and 25 form a signal frequency voltage divider which greatly reduces the signal level at the junction point of resistors 24, 25 and cathode 15. Accordingly, the signal applied to the base 16 is further reduced after cut-off of the transistor 17 is accomplished and the signal ordinarily translated by the cut-off transistor through the resistance of base 16 and collector 18 is diminished by the attenuation introduced by the back resistance of diode 13.

While a single embodiment of the invention has been disclosed as a preferred embodiment many modifications thereof will be apparent in the light of this teaching. For example, an NPN transistor can be used in the invention in combination with a diode connected with reverse polarity to that shown in the drawing. Such modifications as fall within the scope of the appended claims are to be considered as covered by the invention.

I claim:

1. A signal translating circuit for selectively providing gain or attenuation comprising a transistor having emitter, base and collector said base being of opposite conductivity type material to said emitter and said collector, a semiconductor diode having electrodes of opposite conductivity type materials, a direct connection between said base and a like conductivity type electrode of said diode, a voltage divider connected to maintain said base and said like conductivity type electrode at a substantially constant potential, means for forward biasing with respect to said potential said emitter and the remaining electrode of said diode, means for coupling input signals to said remaining electrode, means for applying a control potential in a direction to reduce said forward bias of said transistor, and a second voltage divider receiving said control potential and applying said potential with reduced magnitude to said diode in a direction to reduce the forward bias thereon.

2. Apparatus according to claim 1 in which said control potential varies in accordance with the level of said input signals.

References Cited in the file of this patent

UNITED STATES PATENTS

| | | |
|---|---|---|
| 2,012,433 | Myers | Aug. 27, 1935 |
| 2,774,866 | Burger | Dec. 18, 1956 |
| 2,789,164 | Stanley | Apr. 16, 1957 |
| 2,895,045 | Kagan | July 14, 1959 |
| 2,897,353 | Schweiss | July 28, 1959 |
| 2,904,677 | Heidester | Sept. 15, 1959 |
| 2,967,236 | Freedman | Jan. 3, 1961 |

FOREIGN PATENTS

| | | |
|---|---|---|
| 413,383 | Great Britain | July 19, 1934 |